United States Patent [19]
Takahashi

[11] Patent Number: 5,305,264
[45] Date of Patent: Apr. 19, 1994

[54] STATIC TYPE RANDOM ACCESS MEMORY DEVICE EQUIPPED WITH VARIABLE LOAD CIRCUITS FOR DIGIT LINE PAIRS

[75] Inventor: Hiroyuki Takahashi, Tokyo, Japan
[73] Assignee: Nec Corporation, Tokyo, Japan
[21] Appl. No.: 929,126
[22] Filed: Aug. 13, 1992
[30] Foreign Application Priority Data
Aug. 19, 1991 [JP] Japan .................. 3-232305
[51] Int. Cl.$^5$ .............................................. G11C 7/00
[52] U.S. Cl. .............................. 365/190; 365/189.11; 365/202; 365/203; 365/154; 365/205
[58] Field of Search ............ 365/189.09, 189.11, 365/189.06, 202, 203, 190, 154, 205, 207

[56] References Cited
U.S. PATENT DOCUMENTS

| | | | |
|---|---|---|---|
| 4,760,561 | 7/1988 | Yamamoto et al. | 365/202 |
| 4,933,905 | 6/1990 | Ootani | 365/189.06 |
| 5,034,924 | 7/1991 | Taniguchi et al. | 365/189.11 |
| 5,157,631 | 10/1992 | Shimogawa | 365/189.06 |

OTHER PUBLICATIONS

Odaka, M., et al, A 512 KB/5 ns BiCMOS RAM with 1 KG/150 ps Logic Gate Array, Feb. 15, 1989, 1989 IEEE International Solid-State Circuits Conference.

Primary Examiner—Eugene R. LaRoche
Assistant Examiner—Son Mai
Attorney, Agent, or Firm—Sughrue, Mion, Zinn, Macpeak & Seas

[57] ABSTRACT

A static type random access memory device supplies current from a load circuit to a selected digit line pair in a write-in phase of operation, and the load circuit comprises a first pair of charging transistors coupled between a positive power voltage line and the selected digit line pair in a read-out phase, and a second pair of charging transistor also coupled between the positive power voltage line and the selected digit line pair and responsive to differential voltage indicative of a write-in data bit for selectively coupling one of the digit lines with the positive power voltage line so that the impedance of the load circuit is appropriately adjustable between the read-out phase and the write-in phase.

8 Claims, 9 Drawing Sheets

STATIC TYPE RANDOM ACCESS MEMORY DEVICE EQUIPPED WITH VARIABLE LOAD CIRCUITS FOR DIGIT LINE PAIRS

FIELD OF THE INVENTION

This invention relates to a static type random access memory device and, more particularly, to load circuits for digit line pairs coupled with a static type memory cell array.

DESCRIPTION OF THE RELATED ART

A typical example of the static type random access memory device is illustrated in FIG. 1 of the drawings, and largely comprises a memory cell array 1, load circuits 20 to 2n and two selector units 3 and 4. The memory cell array 1 is implemented by a plurality of memory cells M00, M01, M0n, Mm0, Mm1 and Mmn arranged in rows and columns, and two series combinations of load resistors R1 and R2 and n-channel enhancement type memory transistors Qn1 and Qn2 coupled between a positive power voltage line Vdd and a ground voltage line GND and two n-channel enhancement type switching transistors Qn3 and Qn4 coupled with a pair of memory nodes N1 and N2 form in combination each of the memory cells M00 to Mmn. A data bit is memorized in each of the memory cells M00 to Mmn in the form of differential voltage between the memory nodes N1 and N2, and one of the n-channel enhancement type memory transistors Qn1 and Qn2 is turned on with a positive high voltage level at the associated memory node N2 or N1. A plurality of word lines WL0 to WLm are provided in association with the rows of the memory cell array 1, and each of the word lines WL0 to WLm is coupled with the gate electrodes of the n-channel enhancement type switching transistors Qn3 and Qn4 of the associated row. A plurality of digit line pairs D0 to Dn and CD0 to CDn are associated with the columns of the memory cell array 1, and each of the digit line pairs D0 to Dn and CD0 to CDn is shared between the n-channel enhancement type switching transistors Qn3 and Qn4 of the associated column. The plurality of word lines WL0 to WLm are selectively lifted to a positive high voltage level, and the n-channel enhancement type switching transistors Qn3 and Qn4 coupled therewith simultaneously turn on so as to couple the pairs of memory nodes N1 and N2 with the associated digit line pairs D0 to Dn and CD0 to CDn.

The load circuits 20 to 2n are identical in arrangement with one another, and are associated with the plurality of digit line pairs D0 to Dn and CD0 to CDn, respectively. Each of the load circuits 20 to 2n comprises two pairs of p-channel enhancement type charging transistors Qp5/ Qp6 and Qp7/ Qp8, and the two pairs of p-channel enhancement type charging transistors Qp5 to Qp8 are respectively coupled with the digit lines of the associated digit line pair D0 to Dn and CD0 to CDn. The p-channel enhancement type charging transistors Qp5 and Qp8 are gated by a charging signal line RW, and the gate electrodes of the other p-channel enhancement type charging transistors Qp6 and Qp7 are coupled with the ground voltage line GND. Therefore, the p-channel enhancement type charging transistors Qp5 and Qp8 are shifted between on-state and off-state with the charging signal line RW, and the other p-channel enhancement type charging transistors Qp6 and Qp7 are turned on at all times.

The selector unit 3 is provided for a write-in phase of operation, and the other selector unit 4 is used for a read-out phase of operation. The selector unit 3 comprises a plurality pairs 30 to 3n of n-channel enhancement type switching transistors Qn9 and Qn10 associated with the digit line pairs D0 to Dn and CD0 to CDn, and the plurality pairs 30 to 3n are respectively gated by column selecting signal lines Y0 to Yn. The plurality pairs 30 to 3n share a write-in data bus WD and CWD, and n-channel enhancement type switching transistors Qn9 and Qn10 of each pair are coupled between the digit lines D0/ D1/ Dn and CD0/ CD1/ CDn of the associated digit line pair and the write-in data buts WD and CWD. The column selecting signal lines Y0 to Yn are selectively lifted to the positive high voltage level, and one of the digit line pairs D0 to Dn and CD0 to CDn is coupled with the write-in data bus WD and CWD.

The selector unit 4 also comprises a plurality pairs 40 to 4n of p-channel enhancement type switching transistors Qp11 and Qp12 associated with the digit line pairs D0 to Dn and CD0 to CDn, and the plurality pairs 40 to 4n are respectively gated by complementary column selecting signal lines CY0 to CYn. The plurality pairs 40 to 4n share a read-out data bus RD and CRD, and p-channel enhancement type switching transistors Qp11 and Qp12 of each pair are coupled between the digit lines D0/ D1/ Dn and CD0/ CD1/ CDn of the associated digit line pair and the read-out data buts RD and CRD. The complementary column selecting signal lines CY0 to CYn are selectively decayed to the ground voltage level, and one of the digit line pairs D0 to Dn and CD0 to CDn is coupled with the read-out data bus RD and CRD.

Although other component units such as row and column address decoders and a controller are further incorporated in the prior art static type random access memory device, these component units are deleted from FIG. 1 because of less importance for understanding problems of the prior art.

Description is hereinbelow made on the read-out and write-in phases of operation on the assumption that the memory cell M00 is selected with external row and column address signals. First, the prior art static type random access memory device is assumed to enter the read-out phase of operation. The charging signal line RW goes down to the ground voltage level, and the p-channel enhancement type charging transistors Qp5 and Qp8 concurrently turn on so that the positive power voltage line Vdd is coupled with the digit line pairs D0 to Dn and CD0 to CDn not only through the p-channel enhancement type charging transistors Qp6 and Qp7 but also through the p-channel enhancement type charging transistors Qp5 and Qp8. With the p-channel enhancement type charging transistors Qp6 and Qp7 thus turned on, the impedance of each load circuit 20, 21 or 2nis relatively low, and the digit lines D0 to Dn and CD0 to CDn are dominated by the equivalent on-resistances of the pairs of p-channel enhancement type charging transistors Qp5/ Qp6 and Qp7/ Qp8, respectively.

Subsequently, the word line WL0 is lifted to the positive high voltage level, and the n-channel enhancement type switching transistors Qn3 and Qn4 of the memory cells M00 to M0n concurrently turn on so that the digit line pairs D0 to Dn and CD0 to CDn are respectively coupled with the pairs of memory nodes N1 and N2 of the respective memory cells M00 to Mmn. The complementary column selecting line CY0 is decayed to the ground voltage level, remaining the other complementary column selecting signal lines CY1 to CYn in the positive high voltage level. As a result, only the digit line pair D0 and CD0 is coupled with the read-out data bus RD and CRD, and the other digit line pairs D1 to Dn and CD1 to CDn are isolated from the read-out data bus RD and CRD. Since either n-channel enhancement type memory transistor Qn1 or Qn2 of the memory cell M00 is turned on, and the other memory transistor remains off, one of the digit lines D0 and CD0 is coupled through the associated n-channel enhancement type switching transistor Qn3 or Qn4 and the associated n-channel enhancement type memory transistor Qn1 or Qn2 with the ground voltage line GND, and small differential voltage takes place between the digit lines D0 and CD0. The small differential voltage on the digit line pair D0 and CD0 is transferred through the associated pair 40 of the p-channel enhancement type switching transistors Qp11 and Qp12 to the read-out data bus RD and CRD.

However, if the prior art static type random access memory device enters the write-in phase of operation, the charging signal line RW goes up to the positive high voltage level, and the p-channel enhancement type charging transistors Qp5 and Qp8 concurrently turn off so that the positive power voltage line Vdd is coupled with the digit line pairs D0 to Dn and CD0 to CDn only through the p-channel enhancement type charging transistors Qp6 and Qp7. The impedance of each load circuit 20, 21 or 2n is increased due to the charging signal line RW in the positive high voltage level, and the impedance of each of the digit lines D0 to Dn and CD0 to CDn is dominated by the equivalent on-resistance of the pair of p-channel enhancement type charging transistors Qp6 and Qp7.

Subsequently, the word line WL0 is lifted to the positive high voltage level, and the n-channel enhancement type switching transistors Qn3 and Qn4 of the memory cells M00 to M0n concurrently turn on so that the digit line pairs D0 to Dn and CD0 to CDn are respectively coupled with the pairs of memory nodes N1 and N2 of the respective memory cells M00 to Mmn. The column selecting line Y0 is lifted to the positive high voltage level, remaining the other column selecting signal lines Y1 to Yn in the ground voltage level. As a result, only the digit line pair D0 and CD0 is coupled with the write-in data bus WD and CWD, and the other digit line pairs D1 to Dn and CD1 to CDn are isolated therefrom. Since one of the signal lines WD and CWD is coupled with the ground voltage line GND depending upon the logic level of a write-in data bit, differential voltage indicative of the write-in data bit is developed between the signal lines WD and CWD, and the pair 30 of n-channel enhancement type switching transistors Qn9 and Qn10 allows the digit line pair D0 and CD0 to develop differential voltage under the influence of the differential voltage on the write-in data bus WD and CWD. The differential voltage on the digit line pair D0 and CD0 is transferred through the n-channel enhancement type switching transistors Qn3 and Qn4 of the memory cell M00 to the pair of memory nodes N1 and N2 thereof, and the differential voltage indicative of the write-in data bit affects the voltage levels on the memory nodes N1 and N2 of the memory cell M00. Then, the write-in data bit is stored in the memory cell M00.

However, the other pairs 31 to 3n isolate the associated digit line pairs D1 to Dn and CD1 to CDn from the write-in data bus WD and CWD, and the write-in data bit has no influence on the differential voltages stored in the memory cells M01 to M0n. As described hereinbefore, the p-channel enhancement type charging transistors Qp5 and Qp8 are turned off in the write-in phase of operation, and only a small amount of current is supplied from the positive power voltage line Vdd to the digit line pair D0 and CD0. The small amount of current is branched into the memory cell M00 and the write-in data bus WD and CWD and further to the write-in data bus Wd and CWD, and the high impedance of the load circuit 20 effectively pulls down one of the digit lines D0 and CD0. This results in exact write-in phase of operation.

Thus, the variable impedance of the load circuits not only achieves the high speed read-out phase but also eliminates malfunction from the prior art static type random access memory device in the write-in phase of operation. However, if the impedance of the load circuits is too large, only extremely small amount of current is supplied from the positive power voltage line Vdd to the digit line pairs D0 to Dn and CD0 to CDn, and the differential voltage on the selected digit line pair is affectable with noises. In other words, the logic level indicated by the differential voltage is much liable to be inverted due to the noises. On the other hand, if the impedance is too small, large amount of current only produces small differential voltage on the selected digit line, and the small differential voltage hardly inverts the differential voltage between the memory nodes N1 and N2.

SUMMARY OF THE INVENTION

It is therefore an important object of the present invention provide a static type random access memory device To accomplish the object, the present invention proposes to auxiliary supplying current to either first or second digit line depending upon the logic level of a write-in data bit.

In accordance with the present invention, there is provided a static type random access memory device selectively entering a read-out phase and a write-in phase of operation, comprising: a) a plurality of memory cells arranged in rows and columns, and having pairs of memory nodes each storing a data bit in the form of differential voltage level; b) a plurality of word lines respectively coupled with the rows of the plurality of memory cells; c) a plurality of first digit lines paired with a plurality of second digit lines for providing a plurality of digit line pairs respectively coupled with the columns of the plurality of memory cells; d) column selector means coupled between a data bus and the plurality of digit line pairs for selectively coupling therebetween; and e) a plurality of load circuits associated with the plurality of digit line pairs, and coupled between a source of current and the associated digit line pairs, each of the plurality of load circuits comprising e-1) a pair of first charging transistors responsive to a charging signal indicative of the read-out phase of operation for coupling the associated digit line pair with the source of current, and e-2) a charging means activated in the write-in phase of operation, and responsive to a write-in data bit for selectively supplying current to either first or second digit line of the associated digit line pair.

BRIEF DESCRIPTION OF THE DRAWINGS

The feature and advantages of the static type random access memory device according to the present invention will be more clearly understood from the following description taken in conjunction with the accompanying drawings in which.

DESCRIPTION OF THE PREFERRED EMBODIMENTS

First Embodiment

Figure 1:
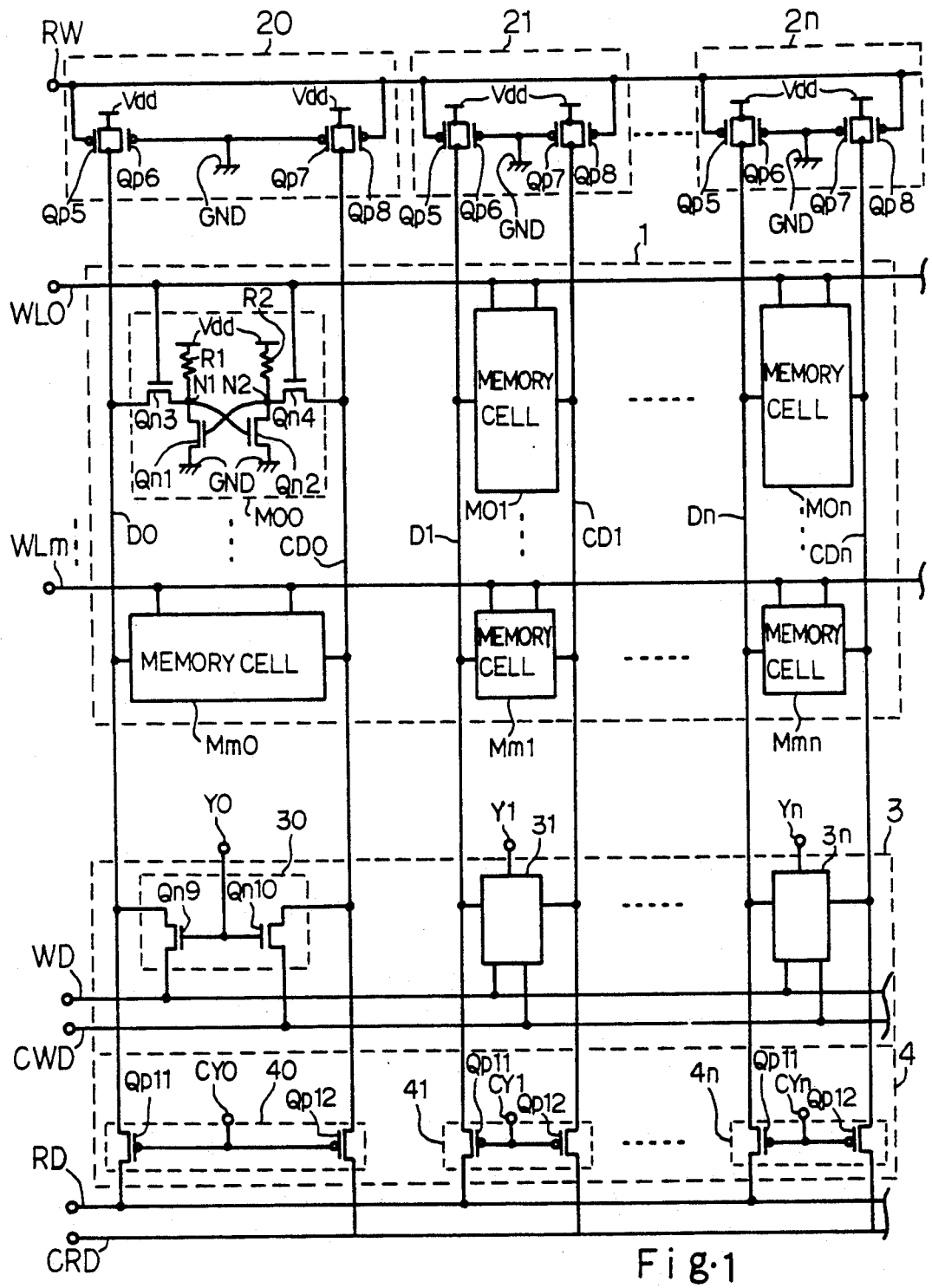
FIG. 1 is a circuit diagram showing the arrangement of the prior art static type random access memory device.
Figure 2:
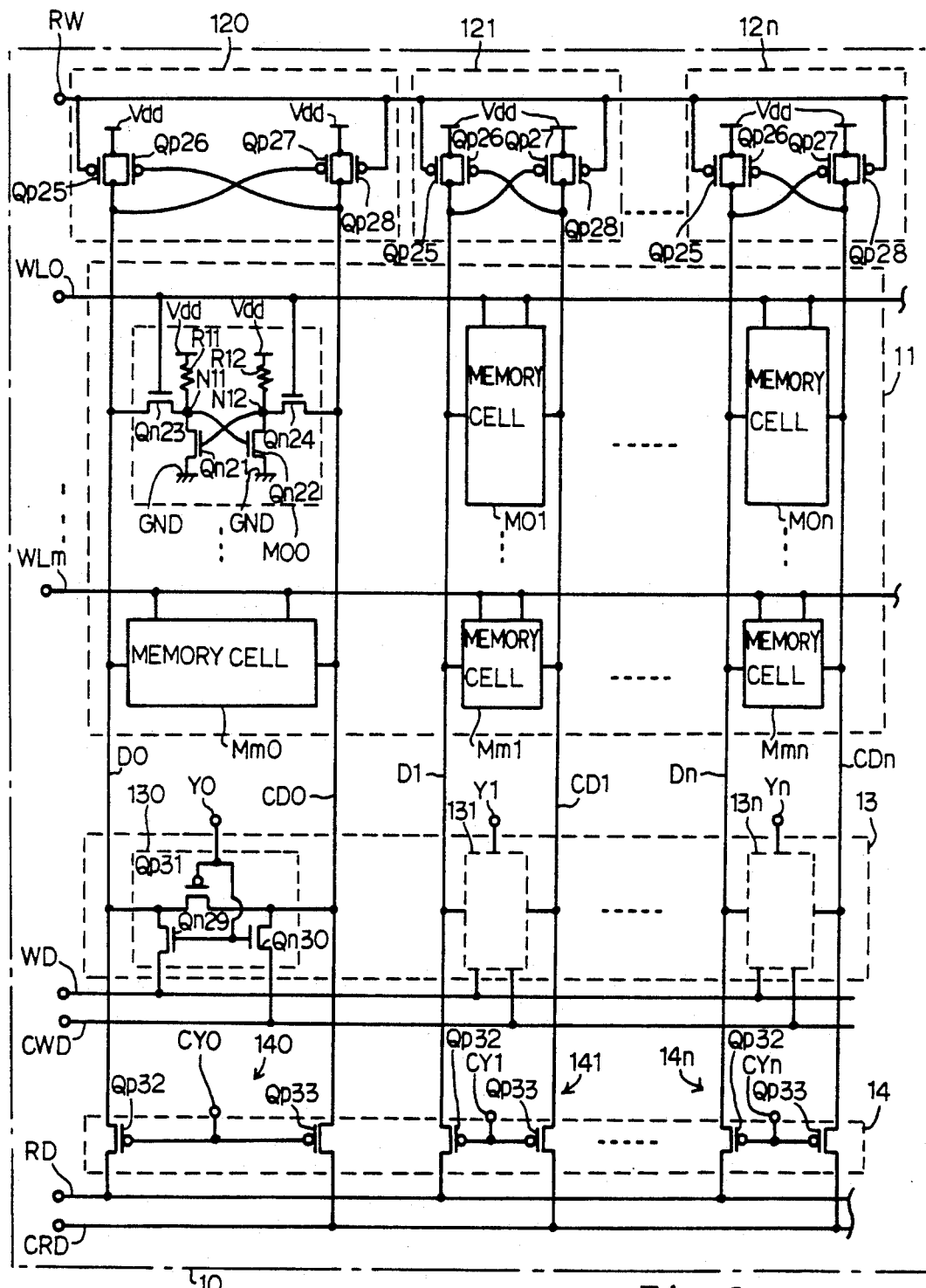
FIG. 2 is a circuit diagram showing the arrangement of a static type random access memory device according to the present invention.

Referring first to FIG. 2 of the drawings, a static type random access memory device embodying the present invention is fabricated on a single semiconductor chip, and largely comprises a memory cell array 11, load circuits 120 to 12n and two selector units 13 and 14. Although other component units such as row and column address decoder units, a controlling circuit, a sense amplifier circuit and an input/ output data buffer unit are further incorporated in the static type random access memory device, these component units are less important in view of the gist of the present invention, and description is not made thereon for the sake of simplicity.

The memory cell array 11 is implemented by a plurality of memory cells M00, M01, M0n, Mm0, Mm1 and Mmn arranged in rows and columns, and two series combinations of load resistors R11 and R12 and n-channel enhancement type memory transistors Qn21 and Qn22 coupled between a positive power voltage line Vdd and a ground voltage line GND and two n-channel enhancement type switching transistors Qn23 and Qn24 coupled with a pair of memory nodes N11 and N12 form in combination each of the memory cells M00 to Mmn as similar to the prior art memory cell. A data bit is memorized in each of the memory cells M00 to Mmn in the form of differential voltage level between the memory nodes N11 and N12, and one of the n-channel enhancement type memory transistors Qn21 and Qn22 is turned on with a positive high voltage level at the associated memory node N12 or N11.

A plurality of word lines WL0 to WLm are provided in association with the rows of the memory cell array 11, and each of the word lines WL0 to WLm is coupled with the gate electrodes of the n-channel enhancement type switching transistors Qn23 and Qn24 of the associated row. A plurality of first digit lines D0 to Dn are respectively paired with a plurality of second digit lines CD0 to CDn so that a plurality of digit line pairs are provided in association with the columns of the memory cell array 11. Each of the digit line pairs D0 to Dn and CD0 to CDn is shared between the n-channel enhancement type switching transistors Qn23 and Qn24 of the associated column. The plurality of word lines WL0 to WLm are selectively lifted to a positive high voltage level, and the n-channel enhancement type switching transistors Qn23 and Qn24 coupled therewith simultaneously turn on so as to conduct the pairs of memory nodes N1 and N2 with the associated digit line pairs D0 to Dn and CD0 to CDn.

The load circuits 120 to 12n are identical in arrangement with one another, and are associated with the plurality of digit line pairs D0 to Dn and CD0 to CDn, respectively. Each of the load circuits 120 to 12n comprises two pairs of p-channel enhancement type charging transistors Qp25/ Qp26 and Qp27/ Qp28, and the two pairs of p-channel enhancement type charging transistors Qp25 to Qp28 are respectively coupled with the first and second digit lines of the associated digit line pair D0 to Dn and CD0 to CDn. The p-channel enhancement type charging transistors Qp25 and Qp28 are gated by a charging signal line RW, and the gate electrodes of the other p-channel enhancement type charging transistors Qp26 and Qp27 are coupled with the second and first digit lines CD0 to CDn and D0 to Dn. Therefore, the p-channel enhancement type charging transistors Qp25 and Qp28 are concurrently shifted between on-state and off-state with the charging signal line RW, and the other p-channel enhancement type charging transistors Qp26 and Qp27 are complementary shifted between on-state and off-state depending upon the logic level of a data bit on the associated digit line pair. As will be described hereinlater, the pair of p-channel enhancement type charging transistors Qp26 and Qp27 are used in the write-in phase, and are turned off in the read-out phase of operation. For this reason, the p-channel enhancement type charging transistors Qp26 and Qp27 are as narrow in channel width as several microns. In this instance, the p-channel enhancement type charging transistors Qp26 and Qp27 as a whole constitute a charging means.

The selector unit 13 is provided for a write-in phase of operation, and the other selector unit 14 is used for a read-out phase of operation. The selector unit 13 comprises a plurality of circuits 130 to 13n or a plurality pairs of n-channel enhancement type switching transistors Qn29 and Qn30 respectively associated with a plurality of p-channel enhancement type balancing transistors Qp31. The pairs of n-channel enhancement type switching transistors Qn29 and Qn30 are respectively coupled between the digit line pairs D0 to Dn and CD0 to CDn and a write-in data bus WD and CWD, and the p-channel enhancement type balancing transistors Qp31 are respectively coupled between the first digit lines D0 to Dn and the second digit lines CD0 to CDn. The plurality pairs of n-channel enhancement type switching transistors Qn29 and Qn30 and the associated p-channel enhancement type balancing transistors Qp31 are respectively gated by column selecting signal lines Y0 to Yn. The pair of n-channel enhancement type switching transistors Qn29 and Qn30 and the associated p-channel enhancement type balancing transistor Qp31 are complimentarily shifted between the on-state and the off-state, and the pairs of n-channel enhancement type switching transistors Qn29 and Qn30 selectively couple the associated bit line pairs with the write-in data bus WD and CWD while the associated p-channel enhancement type balancing transistors Qp31 blocks the conduction paths between the first and second digit lines D0 to Dn and CD0 to CDn. Namely, when the column selecting signal lines Y0 to Yn are selectively lifted to the positive high voltage level, and one of the digit line pairs D0 to Dn and CD0 to CDn is coupled with the write-in data bus WD and CWD, and the other first digit lines are coupled with the second digit lines paired therewith.

The selector unit 14 also comprises a plurality pairs 140 to 14n of p-channel enhancement type switching transistors Qp32 and Qp33 associated with the digit line pairs D0 to Dn and CD0 to CDn, and the plurality pairs 140 to 14n are respectively gated by complementary column selecting signal lines CY0 to CYn. The plurality pairs 140 to 14n share a read-out data bus RD and CRD, and p-channel enhancement type switching transistors Qp32 and Qp33 of each pair are coupled between the digit lines D0/ D1/ Dn and CD0/ CD1/ CDn of the associated digit line pair and the read-out data bus RD and CRD. The complementary column selecting signal lines CY0 to CYn are selectively decayed to the ground voltage level, and one of the digit line pairs D0 to Dn and CD0 to CDn is coupled with the read-out data bus RD and CRD.

Description is hereinbelow made on the read-out and write-in phases of operation on the assumption that the memory cell M00 is selected with external row and column address signals. First, the static type random access memory device is assumed to enter the read-out phase of operation. The charging signal line RW goes down to the ground voltage level, and the p-channel enhancement type charging transistors Qp25 and Qp28 concurrently turn on so that the positive power voltage line Vdd is coupled with the digit line pairs D0 to Dn and CD0 to CDn through the p-channel enhancement type charging transistors Qp25 and Qp28. The digit line pair D0 and CD0 are charged from the positive power voltage line Vdd through the p-channel enhancement type charging transistors Qp25 and Qp28, and the digit line pair D0 and CD0 is elevated toward the positive high voltage level. When the voltage levels on the digit line pair D0 and CD0 exceed the threshold level of the p-channel enhancement type charging transistors Qp26 and Qp27, both of the p-channel enhancement type charging transistors Qp26 and Qp27 transiently turn off.

The word line WL0 is lifted to the positive high voltage level, and the n-channel enhancement type switching transistors Qn23 and Qn24 of the memory cells M00 to M0n concurrently turn on so that the digit line pairs D0 to Dn and CD0 to CDn are respectively coupled with the pairs of memory nodes N11 and N12 of the respective memory cells M00 to Mmn. The complementary column selecting line CY0 is decayed to the ground voltage level, remaining the other complementary column selecting signal lines CY1 to CYn in the positive high voltage level. As a result, only the digit line pair D0 and CD0 is coupled with the read-out data bus RD and CRD, and the other digit line pairs D1 to Dn and CD1 to CDn are isolated from the read-out data bus RD and CRD. The column selecting signal Y0 remains in the positive high voltage level, and the p-channel enhancement type switching transistor Qp31 blocks the conduction path between the first and second digit lines D0 and CD0. Since either n-channel enhancement type memory transistor Qn21 or Qn22 of the memory cell M00 is turned on and the other memory transistor remains off, one of the digit lines D0 and CD0 is coupled through the associated n-channel enhancement type switching transistor Qn23 or Qn24 and the associated n-channel enhancement type memory transistor Qn21 or Qn22 with the ground voltage line GND, and small differential voltage level takes place between the digit lines D0 and CD0. The digit line pair D0 and CD0 have been charged to the positive high voltage level, and the small differential voltage indicative of the read-out data bit is of the order of 100 millivolts. Thus, the differential voltage is so small that the memory cell M00 can drive the associated digit line pair at high speed. The small differential voltage on the digit line pair D0 and CD0 is transferred through the associated pair 140 of the p-channel enhancement type switching transistors Qp32 and Qp33 to the read-out data bus RD and CRD, and is developed by a sense amplifier circuit (not shown). The developed differential voltage is supplied to the data buffer unit (not shown), and an output data signal indicative of the read-out data bit is delivered from the data buffer unit.

If the static type random access memory device enters the write-in phase of operation, the charging signal line RW goes up to the positive high voltage level, and the p-channel enhancement type charging transistors Qp25 and Qp28 concurrently turn off so that the digit line pairs D0 to Dn and CD0 to CDn are decayed toward the ground voltage level. However, when the voltage levels on the digit line pairs D0 to Dn and CD0 to CDn reach the threshold level of the p-channel enhancement type charging transistors Qp26 and Qp27, the p-channel enhancement type charging transistors Qp26 and Qp27 turn on so that the positive power voltage line Vdd is coupled with the digit line pairs D0 to Dn and CD0 to CDn through the p-channel enhancement type charging transistors Qp26 and Qp27.

The word line WL0 is lifted to the positive high voltage level, and the n-channel enhancement type switching transistors Qn23 and Qn24 of the memory cells M00 to M0n concurrently turn on so that the digit line pairs D0 to Dn and CD0 to CDn are respectively coupled with the pairs of memory nodes N11 and N12 of the respective memory cells M00 to Mmn. The column selecting line Y0 is lifted to the positive high voltage level, remaining the other column selecting signal lines Y1 to Yn in the ground voltage level. As a result, only the digit line pair D0 and CD0 is coupled with the write-in data bus WD and CWD, and the other digit line pairs D1 to Dn and CD1 to CDn are isolated therefrom. Since one of the signal lines WD and CWD is coupled with the ground voltage line GND depending upon the logic level of a write-in data bit, differential voltage indicative of the write-in data bit is developed between the signal lines WD and CWD, and the associated pair of n-channel enhancement type switching transistors Qn29 and Qn30 allows the digit line pair D0 and CD0 to develop differential voltage level under the influence of the differential voltage on the write-in data bus WD and CWD. If the write-in data bit results in a higher voltage level on the first digit line D0 rather than the second digit line CD0, the p-channel enhancement type charging transistor Qp26 turns on, allowing the p-channel enhancement type charging transistor Qp27 to remain off. As a result, the first digit line D0 is coupled with the positive power voltage line Vdd, and the positive power voltage line Vdd thus coupled with the first digit line D0 allows the differential voltage to take place on the digit line pair D0 and CD0. The current supplied to the first digit line D0 is large enough to withstand undesirable noises, and the p-channel enhancement type charging transistor Qp27 in the off-state allows the differential voltage to become large. Each memory cell is arranged in a flip flop configuration, and the threshold of the flip flop is usually not larger than 1.0 volt. However, the differential voltage on the selected digit line pair is much larger than the threshold, and the write-in data bit is memorized in the selected memory cell without malfunction. For this reason, the load circuits 120 to 12n improve the reliability of the data bits stored in the memory cells M00 to Mmn, and eliminates malfunction from the static type random access memory device. The other column selecting signal lines Y1 to Yn remains in the ground voltage level, the p-channel enhancement type balancing transistors Qp31 interconnects the first digit lines D1 to Dn and the second digit lines CD1 to CDn, and balance the first digit lines D1 to Dn with the associated second digit lines CD1 to CDn.

Figure 3:
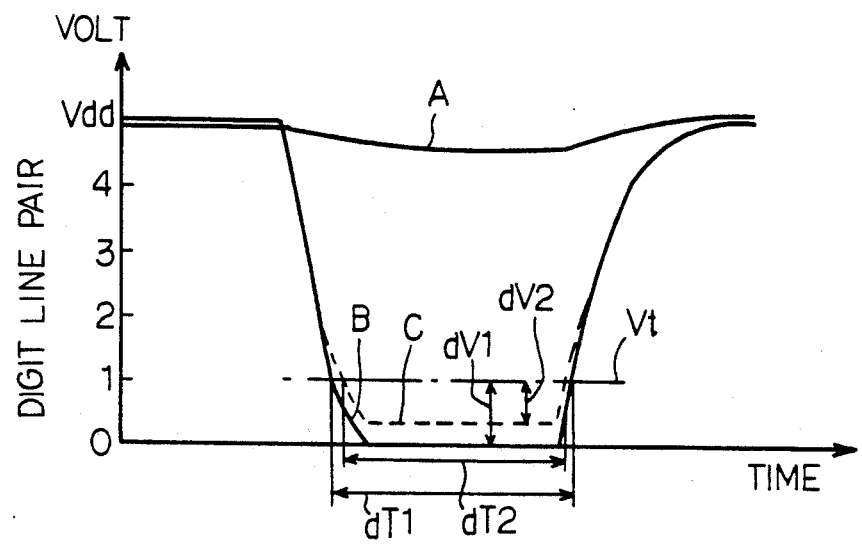
FIG. 3 is a graph showing the voltage characteristics on a digit line pair in the write-in phase of operation.

FIG. 3 shows the voltage characteristics on a digit line pair. If the digit line pair is selected in the write-in phase of operation, one of the first and second digit lines remains around the positive power voltage level Vdd as indicated by Plots A, and the other digit line is decayed to the ground voltage level as indicated by Plots B. However, the prior art load circuit insufficiently lowers one of the digit lines as indicated by plots C. The threshold of each memory cell is assumed to be Vt, and the margin dV1 of the present invention is larger than the margin dV2 of the prior art by 0.2 to 0.5 volt. Accordingly, the memory cell of the present invention is invertible over time period dT1 longer than time period dT2 for the prior art memory cell by 0.3 to 0.5 nano-second. For this reason, the load circuits 120 to 12n achieve reliable write-in characteristics rather than the prior art load circuits 20 to 2n.

Figure 4:
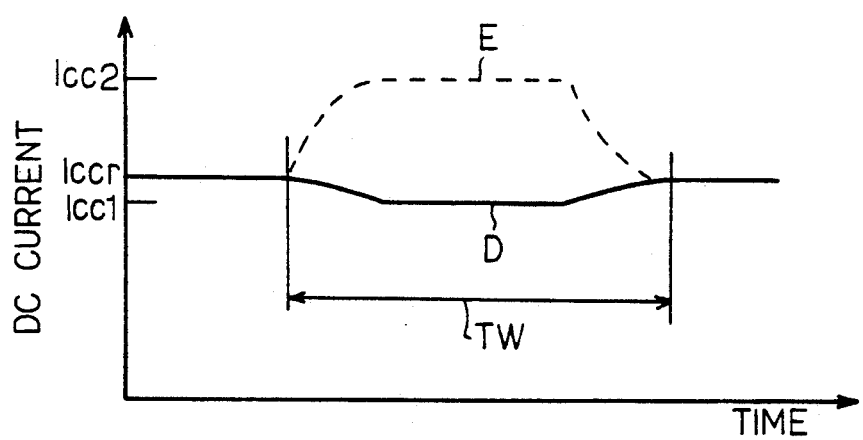
FIG. 4 is a graph showing electric current consumption of the static type random access memory device shown in FIG. 2 in comparison with the electric current consumption of the prior art static type random access memory device.

FIG. 4 shows current consumption D of the static type random access memory device according to the present invention, and plots E stand for the current consumption of the prior art static type random access memory device. A write-in phase of operation is carried out over time period TW, the static type random access memory device of the present invention decreases the current consumption, because the p-channel enhancement type charging transistors Qp26 and Qp27 selectively turn off. However, the prior art static type random access memory device increases the current consumption in the write-in phase of operation. Thus, the load circuits 120 to 12n are effective against the electric power consumption, and the advantage is more attractive for a multi-bit input/ output static type random access memory device.

Second Embodiment

Figure 5:
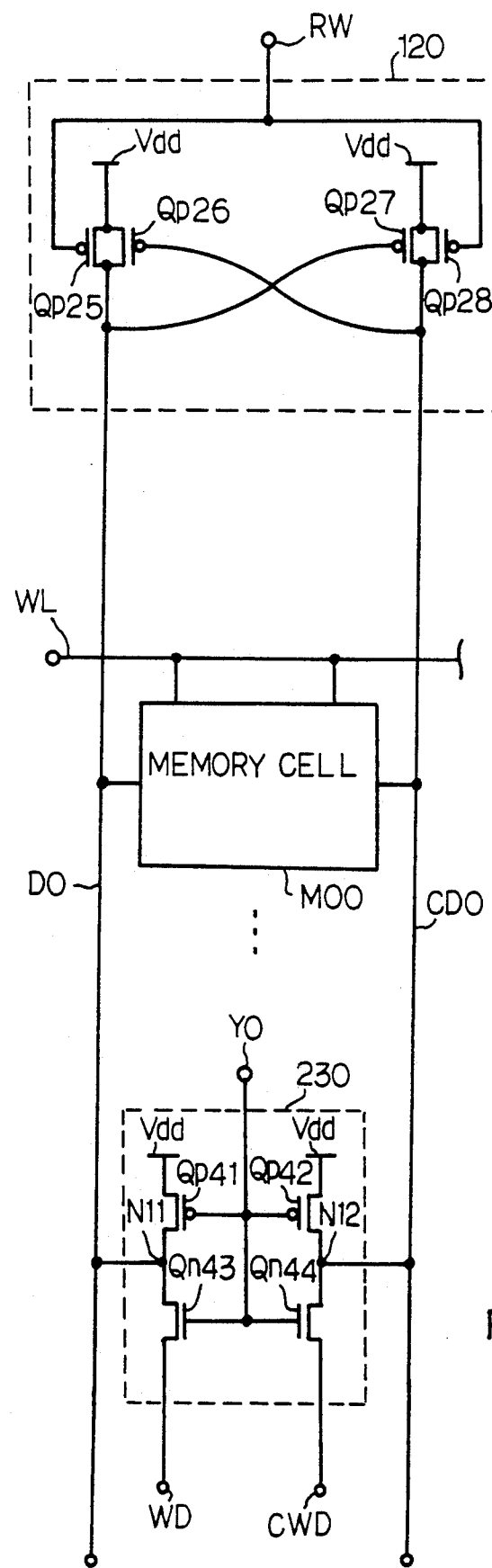
FIG. 5 is a circuit diagram showing the arrangement of a part of another static type random access memory device according to the present invention.

Turning to FIG. 5 of the drawings, a bit line pair D0 and CD0 of another static type random access memory device is coupled with a memory cell M00 associated with a word line WL, and the bit line pair D0 and CD0 is connectable with a positive power voltage line Vdd by means of a load circuit 120. A column selecting circuit 230 is coupled between the digit line pair D0 and CD0 and a write-in data bus WD and CWD, and is responsive to a column selecting signal line Y0. Although the static type random access memory device implementing the second embodiment has a plurality of digit line pairs accompanied with load circuits and column selecting circuits, only one digit line and the associated circuits are illustrated in FIG. 5 for the sake of simplicity. The memory cell M00 and the load circuit 120 are similar in circuit arrangement to those of the first embodiment, and the circuit components are labeled with the same references as those of the first embodiment without detailed description.

The column selecting circuit 230 comprises two series combinations of p-channel enhancement type switching transistors Qp41 and Qp42 and n-channel enhancement type switching transistors Qn43 and Qn44 coupled between the positive power voltage line Vdd and the write-in data bus WD and CWD. All of the enhancement type switching transistors Qp41, Qp42, Qn43 and Qn44 are gated by the column selecting signal line Y0, and the first and second digit lines D0 and CD0 are coupled with the common drain nodes N11 and N12 of the two series combinations.

The column selecting circuit 230 thus arranged behaves as follows. Assuming now that the digit line pair D0 and CD0 is selected by the column selecting signal line Y0 of a positive high voltage level in the write-in phase of operation, the n-channel enhancement type switching transistors Qn43 and Qn44 turn on, and the digit line pair D0 and CD0 is coupled with the write-in data bus WD and CWD. However, if another digit line pair is selected, the column selecting signal line Y0 remains in the ground voltage level, and the p-channel enhancement type switching transistors Qp41 and Qp42 turn on instead of the n-channel enhancement type switching transistors Qn43 and Qn44. Therefore, current is supplied from the positive power voltage line Vdd through the p-channel enhancement type switching transistors Qp41 and Qp42 to the digit line pair D0 and CD0, and the digit line pair D0 and CD0 are lifted around the positive power voltage level. Therefore, the non-selected digit line pair D0 and CD0 are stable in voltage level, and malfunction hardly takes place in the non-selected memory cell M00.

Third Embodiment

Figure 6:
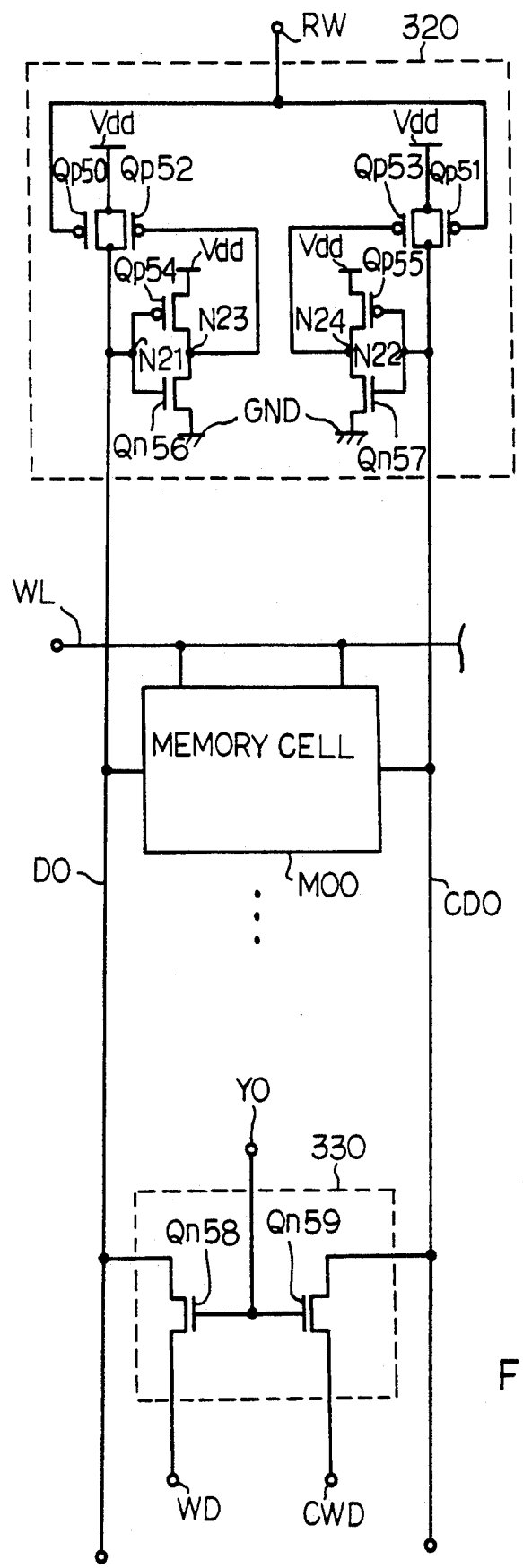
FIG. 6 is a circuit diagram showing the arrangement of a part of yet another static type random access memory device according to the present invention.

Turning to FIG. 6 of the drawings, a bit line pair D0 and CD0 of yet another static type random access memory device is coupled with a memory cell M00 associated with a word line WL, and the bit line pair D0 and CD0 is connectable with a positive power voltage line Vdd by means of a load circuit 320. A column selecting circuit 330 is coupled between the digit line pair D0 and CD0 and a write-in data bus WD and CWD, and is responsive to a column selecting signal line Y0. Although the static type random access memory device implementing the third embodiment has a plurality of digit line pairs accompanied with load circuits and column selecting circuits, only one digit line and the associated circuits are illustrated in FIG. 6 for the sake of simplicity. The memory cell M00 is similar in circuit arrangement to those of the first embodiment, and no further description is incorporated hereinbelow.

The load circuit 320 comprises a pair of p-channel enhancement type charging transistors Qp50 and Qp51 coupled between a positive power voltage line Vdd and the digit line pair D0 and CD0, a pair of p-channel enhancement type charging transistors Qp52 and Qp53 also coupled between the positive power voltage line Vdd and the digit line pair D0 and CD0, inverters respectively implemented by series combinations of p-channel enhancement type switching transistors Qp54 and Qp55 and n-channel enhancement type switching transistors Qn56 and Qn57 coupled between the positive power voltage line Vdd and the ground voltage line GND. The pair of p-channel enhancement type charging transistors Qp50 and Qp51 are responsive to a charging signal RW, and concurrently turn on in a read-out phase of operation. However, the pair of p-channel enhancement type charging transistors Qp50 and Qp51 are turned off in a write-in phase of operation. On the other hand, the pair of p-channel enhancement type charging transistors Qp52 and Qp53 are complimentarily gated by the inverters. Namely, the input nodes N21 and N22 of the inverters are coupled with the digit line pair D0 and CD0, and the output nodes N23 and N24 are coupled with the gate electrodes of the p-channel enhancement type charging transistors Qp52 and Qp53. Since differential voltage indicative of a write-in data bit is applied to the digit line pair D0 and CD0, the inverters couples the output nodes N23 and N24 with the positive power voltage line Vdd and the ground voltage line GND and vice versa depending upon the logic level of the write-in data bit, and one of the p-channel enhancement type charging transistors Qp52 and Qp53 turns on, remaining the other in the off-state in the write-in phase of operation. Thus, one of the digit lines D0 and CD0 is coupled through one of the p-channel enhancement type charging transistors Qp52 and Qp53 with the positive power voltage line Vdd.

The column selecting circuit 330 is implemented by a pair of n-channel enhancement type switching transistors Qn58 and Qn59 coupled between the pair of digit lines D0 and CD0 and the write-in data bus WD and CWD, and the n-channel enhancement type switching transistors Qn58 and Qn59 turn on with a column selecting signal line Y0 when the digit line pair D0 and CD0 is selected in the write-in phase of operation.

The load circuit 320 achieves the same advantages as the first embodiment, and no further description is made thereon for avoiding repetition.

Fourth Embodiment

Figure 7:
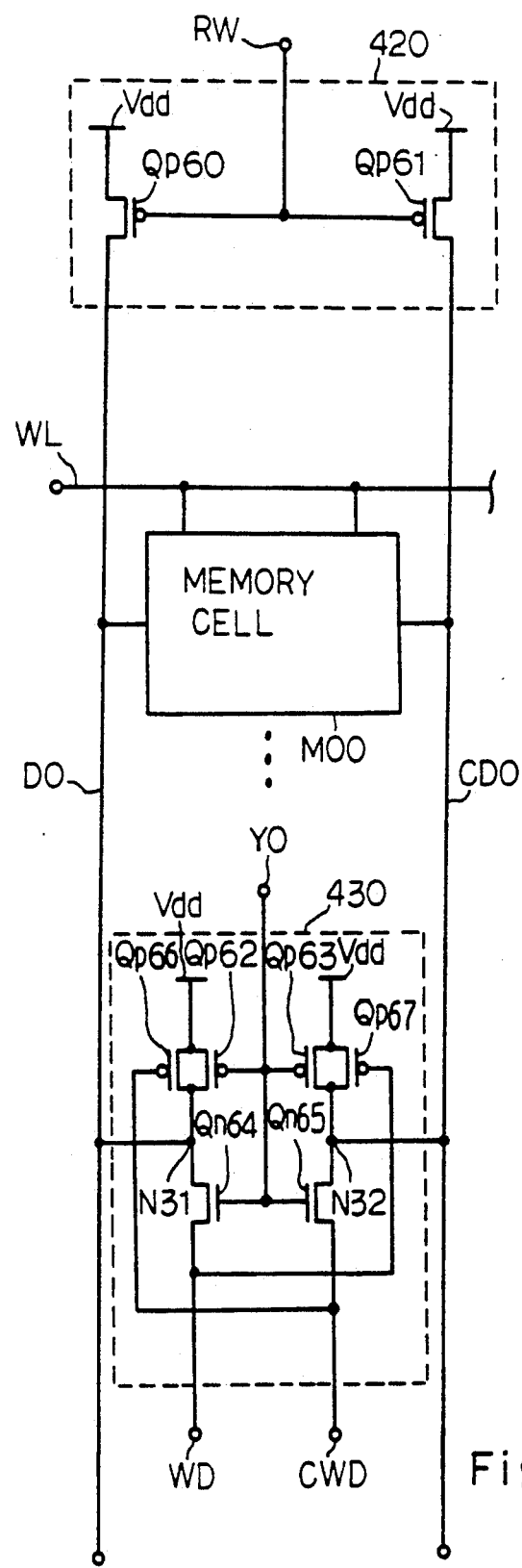
FIG. 7 is a circuit diagram showing the arrangement of a part of still another static type random access memory device according to the present invention.

Turning to FIG. 7 of the drawings, a bit line pair D0 and CD0 of still another static type random access memory device is coupled with a memory cell M00 associated with a word line WL, and the bit line pair D0 and CD0 is connectable with a positive power voltage line Vdd by means of a load circuit 420. A combined circuit 430 of a column selector and a current charger is coupled between the digit line pair D0 and CD0 and a write-in data bus WD and CWD, and is responsive to a column selecting signal line Y0. Although the static type random access memory device implementing the fourth embodiment has a plurality of digit line pairs accompanied with load circuits and column selecting circuits, only one digit line and the associated circuits are illustrated in FIG. 7 for the sake of simplicity. The memory cell M00 is similar in circuit arrangement to those of the first embodiment, and no further description is incorporated hereinbelow.

The load circuit 420 comprises a pair of p-channel enhancement type charging transistors Qp60 and Qp61 coupled between a positive power voltage line Vdd and the digit line pair D0 and CD0, and the p-channel enhancement type charging transistors Qp60 and Qp61 are responsive to a charging signal RW for concurrently turning on in a read-out phase of operation. However, the p-channel enhancement type charging transistors Qp60 and Qp61 are turned off in a write-in phase of operation.

The combined circuit 430 comprises two series combinations of p-channel enhancement type switching transistors Qp62 and Qp63 and n-channel enhancement type switching transistors Qn64 and Qn65 coupled between the positive power voltage line Vdd and the write-in data bus WD and CWD. These switching transistors Qp62, Qp63, Qn64 and Qn65 form in combination a column selecting section, and couples the digit line pair D0 and CD0 with the write-in data bus WD and CWD when the digit line pair D0 and CD0 is selected in the write-in phase of operation. However, if the digit line pair D0 and CD0 is non-selected in the write-in phase of operation, the column selecting section couples the positive power voltage line Vdd with the digit line pair D0 and CD0.

The combined circuit further comprises a pair of p-channel enhancement type charging transistors Qp66 and Qp67 coupled in parallel between the positive power voltage line Vdd and the common drain nodes N31 and N32 of the series combinations. The p-channel enhancement type charging transistors Qp66 and Qp67 are gated by the write-in data bus CWD and WD, and are complementarily shifted between on-state and off-state in the write-in phase of operation. Namely, if the digit line pair D0 and CD0 is selected in the write-in phase, one of the p-channel enhancement type charging transistors Qp66 and Qp67 turns on, and the other is turned off, thereby charging one of the first and second digit lines D0 and CD0. However, if the digit line pair D0 and CD0 is not selected in the write-in phase, the write-in data bus WD and CWD keeps the p-channel enhancement type charging transistors Qp66 and Qp67 off. The p-channel enhancement type charging transistors Qp66 and Qp67 serves as a charging means.

The charging means and the load circuit 420 achieve all of the advantages of the present invention, and the circuit components of the load circuit 420 are decreased rather than that of the first embodiment.

Fifth Embodiment

Figure 8:
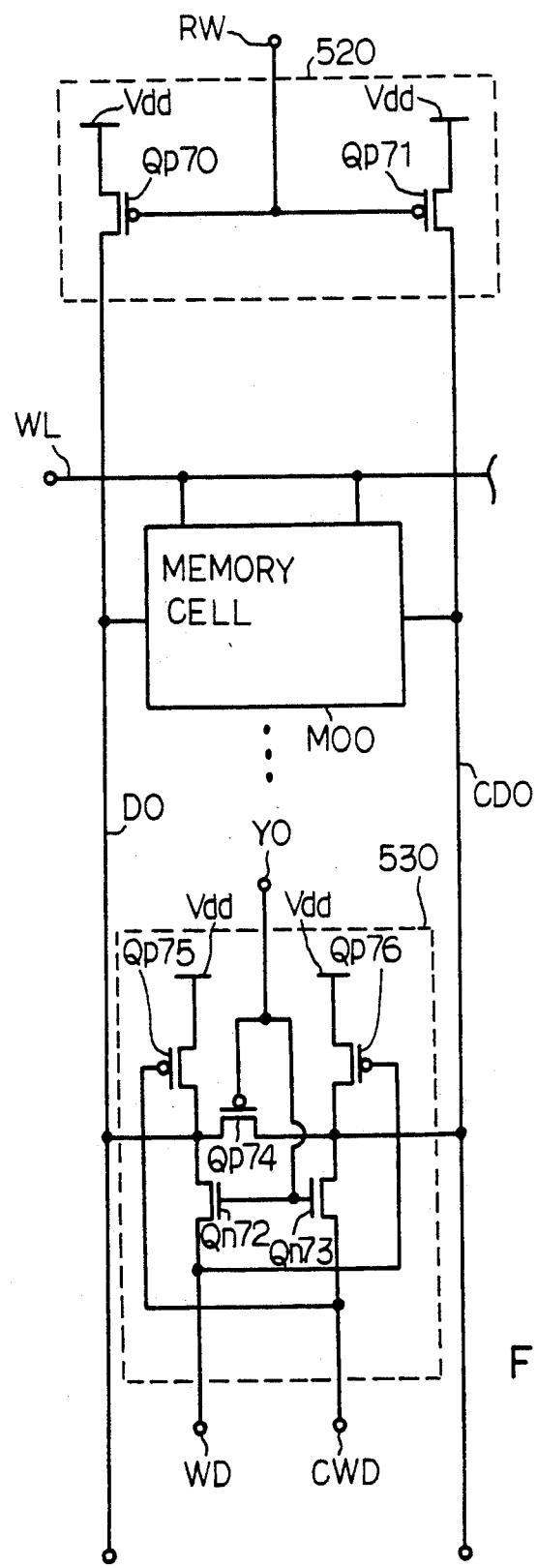
FIG. 8 is a circuit diagram showing the arrangement of a part of still another static type random access memory device according to the present invention.

Turning to FIG. 8 of the drawings, a bit line pair D0 and CD0 of still another static type random access memory device is coupled with a memory cell M00 associated with a word line WL, and the bit line pair D0 and CD0 is connectable with a positive power voltage line Vdd by means of a load circuit 520. A combined circuit 530 of a column selector and a current charger is coupled between the digit line pair D0 and CD0 and a write-in data bus WD and CWD, and is responsive to a column selecting signal line Y0. Although the static type random access memory device implementing the fifth embodiment has a plurality of digit line pairs accompanied with load circuits and column selecting circuits, only one digit line and the associated circuits are illustrated in FIG. 8 for the sake of simplicity. The memory cell M00 is similar in circuit arrangement to those of the first embodiment, and no further description is incorporated hereinbelow.

The load circuit 520 comprises a pair of p-channel enhancement type charging transistors Qp70 and Qp71 coupled between a positive power voltage line Vdd and the digit line pair D0 and CD0, and the p-channel enhancement type charging transistors Qp70 and Qp71 are responsive to a charging signal RW for concurrently turning on in a read-out phase of operation. However, the p-channel enhancement type charging transistors Qp70 and Qp71 are turned off in a write-in phase of operation.

The combined circuit 530 comprises a pair of n-channel enhancement type switching transistors Qn72 and Qn73 coupled between the associated digit line pair D0 and CD0 and a write-in data bus WD and CWD, and a p-channel enhancement type switching transistor Qp74 coupled between the first and second digit lines D0 and CD0. These switching transistors Qn72, Qn73 and Qp74 form in combination a column selecting section, and couples the digit line pair D0 and CD0 with the write-in data bus WD and CWD when the digit line pair D0 and CD0 is selected in the write-in phase of operation. However, if the digit line pair D0 and CD0 is non-selected in the write-in phase of operation, the column selecting section couples the first digit line D0 with the second digit line CD0 through the p-channel enhancement type balancing transistor Qp74.

The combined circuit 530 further comprises a pair of p-channel enhancement type charging transistors Qp75 and Qp76 coupled in parallel between the positive power voltage line Vdd and the digit line pair D0 and CD0. The p-channel enhancement type charging transistors Qp75 and Qp76 are gated by the write-in data bus CWD and WD, and complementarily shifted between on-state and off-state in the write-in phase of operation. Namely, if the digit line pair D0 and CD0 is selected in the write-in phase, one of the p-channel enhancement type charging transistors Qp75 and Qp76 turns on, and the other is turned off, thereby charging one of the first and second digit lines D0 and CD0. However, if the digit line pair D0 and CD0 is not selected in the write-in phase, the write-in data bus WD and CWD keeps the p-channel enhancement type charging transistors Qp75 and Qp76 off. The p-channel enhancement type charging transistors Qp75 and Qp76 serve as a charging means.

The charging means and the load circuit 420 achieve all of the advantages of the present invention, and the circuit components of the load circuit 420 are decreased rather than that of the first embodiment.

Sixth Embodiment

Figure 9:
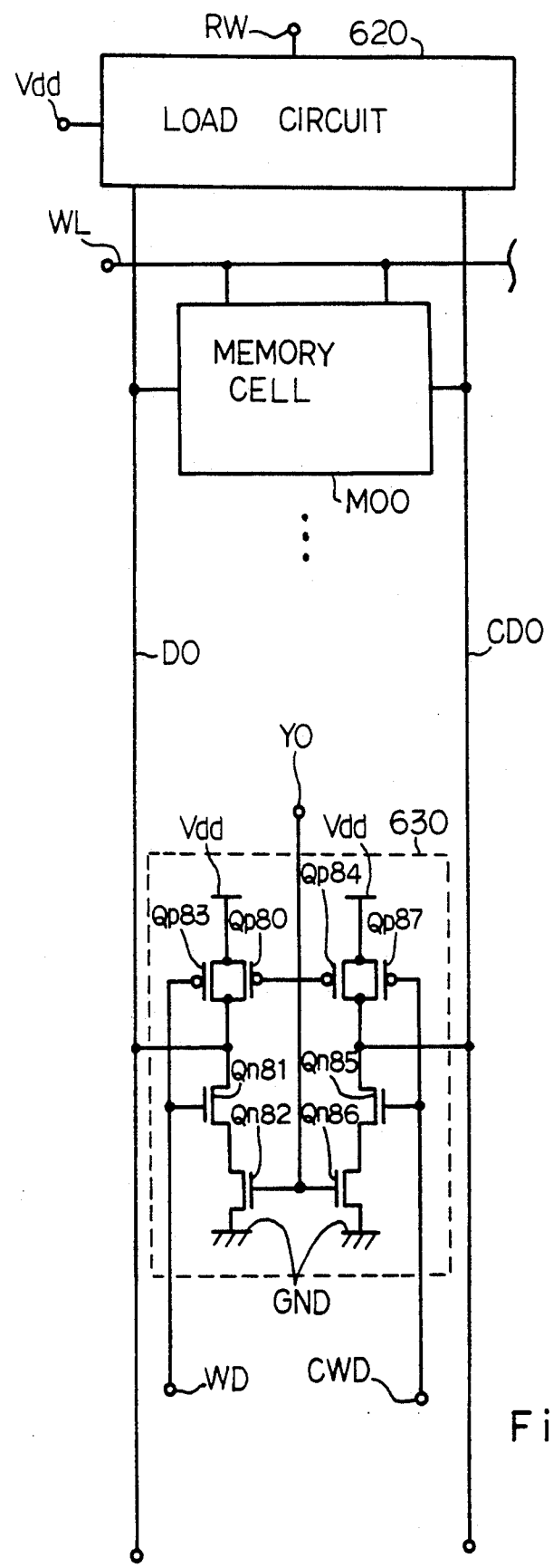
FIG. 9 is a circuit diagram showing the arrangement of a part of still another static type random access memory device according to the present invention.

Turning to FIG. 9 of the drawings, a bit line pair D0 and CD0 of still another static type random access memory device is coupled with a memory cell M00 associated with a word line WL, and the bit line pair D0 and CD0 is connectable with a positive power voltage line Vdd by means of a load circuit 620. A combined circuit 630 of a column selector and a current charger is coupled between the digit line pair D0 and CD0 and a write-in data bus WD and CWD, and is responsive to a column selecting signal line Y0. Although the static type random access memory device implementing the sixth embodiment has a plurality of digit line pairs accompanied with load circuits and column selecting circuits, only one digit line and the associated circuits are illustrated in FIG. 9 for the sake of simplicity. The memory cell M00 and the load circuit 620 are similar in circuit arrangement to those of the fifth embodiment, and no further description is incorporated hereinbelow.

The combined circuit 630 comprises first and second NAND gates. The first NAND gate is implemented by a series combination of a p-channel enhancement type switching transistor Qp80 and n-channel enhancement type switching transistors Qn81 and Qn82 coupled between a positive power voltage line Vdd and a ground voltage line GND as well as a p-channel enhancement type switching transistor Qp83 coupled between the positive power voltage line Vdd and the ground voltage line GND, and a second NAND gate is also implemented by a series combination of a p-channel enhancement type switching transistor Qp84 and n-channel enhancement type switching transistors Qn85 and Qn86 coupled between the positive power voltage line Vdd and the ground voltage line GND as well as a p-channel enhancement type switching transistor Qp87. The first and second NAND gates have respective first input nodes coupled with the write-in data bus WD and CWD, respective second input nodes both coupled with the column selecting signal line Y0, and respective output nodes coupled with the digit line pair D0 and CD0. The first and second NAND gates are enabled with the column selecting signal of a positive high voltage level, and selectively couple the digit line pair D0 and CD0 with the positive power voltage line Vdd and the ground voltage line GND depending upon the logic level of a write-in data bit on the write-in data bus in a write-in phase of operation. The combined circuit 630 serves as not only a selector means but also a charging means.

The advantages of the present invention are achieved by the combination of the load circuit 620 and the combined circuit 630. However, description is omitted for avoiding repetition.

Seventh Embodiment

Figure 10:
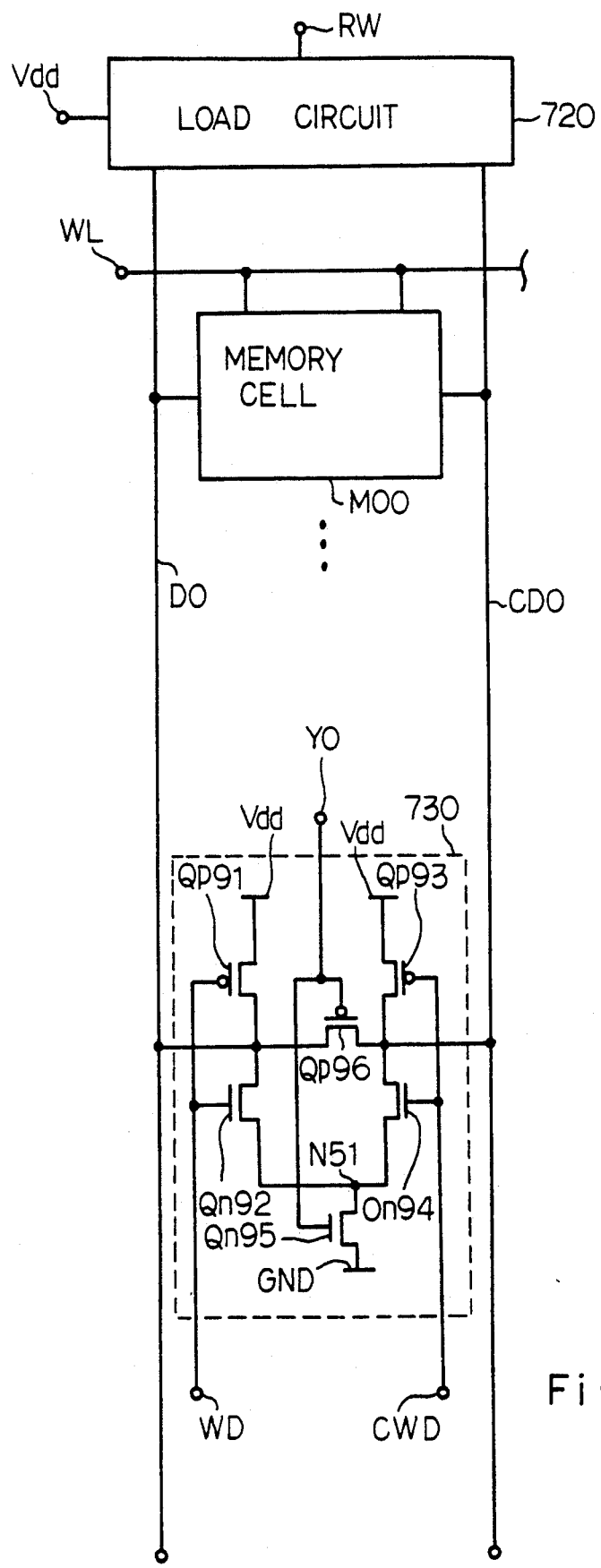
FIG. 10 is a circuit diagram showing the arrangement of a part of still another static type random access memory device according to the present invention.

Turning to FIG. 10 of the drawings, a bit line pair D0 and CD0 of still another static type random access memory device is coupled with a memory cell M00 associated with a word line WL, and the bit line pair D0 and CD0 is connectable with a positive power voltage line Vdd by means of a load circuit 720. A combined circuit 730 of a column selector and a current charger is coupled between the digit line pair D0 and CD0 and a write-in data bus WD and CWD, and is responsive to a column selecting signal line Y0. Although the static type random access memory device implementing the seventh embodiment has a plurality of digit line pairs accompanied with load circuits and column selecting circuits, only one digit line and the associated circuits are illustrated in FIG. 10 for the sake of simplicity. The memory cell M00 and the load circuit 720 are similar in circuit arrangement to those of the fifth embodiment, and no further description is incorporated hereinbelow.

The combined circuit 730 comprises a first inverter implemented by a series combination of a p-channel enhancement type switching transistor Qp91 and an n-channel enhancement type switching transistor Qn92 coupled between a positive power voltage line Vdd and a common node N51, a second inverter implemented by a series combination of a p-channel enhancement type switching transistor Qp93 and an n-channel enhancement type switching transistor Qn94 also coupled between the positive power voltage line Vdd and the common node N51, an n-channel enhancement type switching transistor Qn95 coupled between the common node N51 and a ground voltage line GND, and a p-channel enhancement type balancing transistor Qp96 coupled between the first and second digit lines D0 and CD0. The enhancement type switching transistors Qp91, Qn92, Qp93 and Qn94 are gated by the write-in data bus WD and CWD, and the n-channel enhancement type switching transistor Qn95 and the p-channel enhancement type switching transistor Qp96 are responsive to a column selecting signal on the signal line Y0. The combined circuit 730 serves as not only a selector means but also a charging means.

The combined circuit 730 thus arranged behaves in a write-in phase of operation as follows. While the digit line pair D0 and CD0 is not selected, the column selecting signal remains in the ground voltage level, and the p-channel enhancement type switching transistor Qp96 conducts the first and second digit lines D0 and CD0 with one another. Since either p-channel enhancement type switching transistor Qp91 or Qp93 turns on, the positive power voltage line Vdd supplies current to either first or second digit line D0 or CD0, and the p-channel enhancement type switching transistor Qp96 in the on-state balances the first digit line D0 with the second digit line CD0.

On the other hand, if the column selecting signal line Y0 goes up to the positive high voltage level, the p-channel enhancement type switching transistor Qp96 turns off, and the n-channel enhancement type switching transistor Qn95 turns on. Then, the first digit line D0 is isolated from the second digit line, and the n-channel enhancement type switching transistor Qn95 causes the first and second inverters become responsive to a write-in data bit. The first and second inverters complementarily couple the first and second digit lines D0 and CD0 with the positive power voltage line Vdd and the ground voltage line GND, and one of the first and second digit lines D0 and CD0 selectively goes up to the positive high voltage level, pulling down the other digit line to the ground voltage level.

The seventh embodiment also achieves the advantages of the present invention; however, no description is incorporated hereinbelow.

Although particular embodiments of the present invention have been shown and described, it will be obvious to those skilled in the art that various changes and modifications may be made without departing from the spirit and scope of the present invention. For example, the present invention is applicable to a semicustom-made integrated circuit with a static type random access memory block.

What is claimed is:

1. A static type random access memory device selectively entering a read-out phase and a write-in phase of operation, comprising:
   a) a plurality of memory cells arranged in rows and columns, and having pairs of memory nodes each storing a data bit in the form of differential voltage level;
   b) a plurality of word lines respectively coupled with the rows of said plurality of memory cells;
   c) a plurality of first digit lines paired with a plurality of second digit lines for providing a plurality of digit line pairs respectively coupled with the columns of said plurality of memory cells;
   d) column selector means coupled between a data bus and said plurality of digit line pairs for selectively coupling therebetween, and comprising d-1) a plurality pairs of switching transistors selectively coupling said plurality of digit line pairs with said data bus in said write-in phase of operation, and d-2) a plurality of balancing transistors coupled between said first digit lines and said second digit lines, respectively, and operative to conduct first and second digit lines of digit line pairs selected from said plurality of digit line pairs when said digit line pairs are non-selected in said write-in phase of operation; and
   e) a plurality of load circuits associated with said plurality of digit line pairs, and coupled between a source of current and said associated digit line pairs, each of said plurality of load circuits comprising e-1) a pair of first charging transistors responsive to a charging signal indicative of said read-out phase for coupling the associated digit line pair with said source of current, and e-2) a charging means activated in said write-in phase of operation, and responsive to a write-in data bit for selectively supplying current to either first or second digit line of the associated digit line pair.

2. A static type random access memory device as set forth in claim 1, in which said charging means comprises e-1) a pair of second charging transistors coupled between said source of current and said first and second digit lines of the associated digit line pair, and having respective gate electrodes coupled with said second and first digit lines of the associated digit line, one of said second charging transistors being larger in impedance than the other of said second charging transistors when said associated digit line pair is selected in said write-in phase of operation.

3. A static type random access memory device as set forth in claim 1, in which said charging means comprises e-4) a pair of second charging transistors coupled between said source of current and said first and second digit lines of the associated digit line pair, and responsive to a differential voltage indicative of said write-in data bit for supplying current to one of said first and second digit lines in said write-in phase of operation.

4. A static type random access memory device selectively entering a read-out phase and a write-in phase of operation, comprising:
   a) a plurality of memory cells arranged in rows and columns, and having pairs of memory nodes each storing a data bit in the form of differential voltage level;
   b) a plurality of word lines respectively coupled with the rows of said plurality of memory cells;
   c) a plurality of first digit lines paired with a plurality of second digit lines for providing a plurality of digit line pairs respectively coupled with the columns of said plurality of memory cells;
   d) column selector means coupled between a data bus and said plurality of digit line pairs for selectively coupling therebetween; and
   e) a plurality of load circuits associated with said plurality of digit line pairs, and coupled between a source of current and said associated digit line pairs, each of said plurality of load circuits comprising e-1) a pair of first charging transistors responsive to a charging signal indicative of said read-out phase for coupling the associated digit line pair with said source of current, and e-2) a charging means activated in said write-in phase of operation, and responsive to a write-in data bit for selectively supplying current to either first or second digit line of the associated digit line pair, said charging means comprising a pair of second charging transistors coupled between said source of current and said first and second digit lines of the associated digit line pair, and first and second inverters having respective input nodes coupled with said first and second digit lines, and respective output nodes respectively coupled with gate electrodes of said second charging transistors, one of said second charging transistors being larger in impedance than the other of said second charging transistors when said associated digit line pair is selected in said write-in phase of operation.

5. A static type random access memory device as set forth in claim 4, in which said column selector means comprises d-3) a first series combination of first enhancement type switching transistor of first channel conductivity type and a second enhancement type switching transistor of second channel conductivity type opposite to said first channel conductivity type, and d-4) a second series combination of a third enhancement type switching transistor of said first channel conductivity type and a fourth enhancement type switching transistor of said second channel conductivity type, one of said plurality of digit line pairs being coupled with common drain nodes of said first and second series combinations, said first to fourth enhancement type switching transistors being responsive to a column selecting signal for selectively coupling said one of said digit line pairs with said source of current source and said write-in data bus. and a write-in phase of operation, comprising:
  a) a plurality of memory cells arranged in rows and columns, and having pairs of memory nodes each storing a data bit in the form of differential voltage level;
  b) a plurality of word lines respectively coupled with the rows of said plurality of memory cells;
  c) a plurality of first digit lines paired with a plurality of second digit lines for providing a plurality of digit lines pairs respectively coupled with the columns of said plurality of memory cells;
  d) column selector means coupled between a data bus and said plurality of digit line pairs for selectively coupling therebetween; and
  e) a plurality of load circuits associated with said plurality of digit line pairs, and coupled between a source of current and said associated digit line pairs, each of said plurality of load circuits comprising e-1) a pair of first charging transistors responsive to a charging signal indicative of said read-out phase for coupling the associated digit line pair with said source of current, and e-2) a charging means activated in said write-in phase of operation, and responsive to a write-in data bit for selectively supplying current to either first or second digit line of the associated digit line pair, said charging means comprising a pair of second charging transistors coupled between said source of current and said first and second digit lines of the associated digit line pair, and first and second inverters having respective input nodes coupled with said first and second digit lines, and respective output nodes respectively coupled with gate electrodes of said second charging transistors, one of said second charging transistors being larger in impedance than the other of said second charging transistors when said associated digit line pair is selected in said write-in phase of operation.

6. A static type random access memory device as set forth in claim 4, in which said column selector means comprises d-5) a pair of switching transistors coupled between the associated digit line pair and said data bus, and responsive to a column selecting signal in said write-in phase of operation for coupling therebetween when said associated digit line pair is selected by said column selecting signal, and d-6) a balancing transistor coupled between said first and second digit lines of said associated digit line pair, and responsive to said column selecting signal for conducting said first and second digit lines when said associated digit line pair is non-selected in said write-in phase of operation.

7. A static type random access memory device selectively entering a read-out phase and a write-in phase of operation, comprising:
  a) a plurality of memory cells arranged in rows and columns, and having pairs of memory nodes each storing a data bit in the form of differential voltage level;
  b) a plurality of word lines respectively coupled with the rows of said plurality of memory cells;
  c) a plurality of first digit lines paired with a plurality of second digit lines for providing a plurality of digit line pairs respectively coupled with the columns of said plurality of memory cells;
  d) column selector means coupled between a data bus and said plurality of digit line pairs for selectively coupling therebetween; and
  e) a plurality of load circuits associated with said plurality of digit line pairs, and coupled between a source of current and said associated digit line pairs, each of said plurality of load circuits comprising e-1) a pair of first charging transistors responsive to a charging signal indicative of said read-out phase for coupling the associated digit line pair with said source of current, and e-2) a charging means activated in said write-in phase of operation, and responsive to a write-in data bit for selectively supplying current to either first or second digit line of the associated digit line pair, said column selector means being combined with said charging means for forming a combined circuit, said combined circuit comprising two NAND gates having first input nodes supplied with differential voltage indicative of said write-in data bit, second input nodes supplied with a column selecting signal and output nodes coupled with said first and second digit lines of the associated digit line pair.

8. A static type random access memory device selectively entering a read-out phase and a write-in phase of operation, comprising:
  a) a plurality of memory cells arranged in rows and columns, and having pairs of memory nodes each storing a data bit in the form of differential voltage level;
  b) a plurality of word lines respectively coupled with the rows of said plurality of memory cells;
  c) a plurality of first digit lines paired with a plurality of second digit lines for providing a plurality of digit line pairs respectively coupled with the columns of said plurality of memory cells;

d) column selector means coupled between a data bus and said plurality of digit line pairs for selectively coupling therebetween; and e) a plurality of load circuits associated with said plurality of digit line pairs, and coupled between a source of current and said associated digit line pairs, each of said plurality of load circuits comprising e-1) a pair of first charging transistors responsive to a charging signal indicative of said read-out phase for coupling the associated digit line pair with said source of current, and e-2) a charging means activated in said write-in phase of operation, and responsive to a write-in data bit for selectively supplying current to either first or second digit line of the associated digit line pair, said selector means being combined with said charging means for forming a combined circuit, said combined circuit comprising first and second inverters having respective input nodes supplied with differential voltage indicative of said write-in data bit and respective output nodes coupled with said first and second digit lines of the associated digit line pair, an activation transistor provided in association with said first and second inverters and allowing said first and second inverters to become responsive to said write-in data bit in the presence of a column selecting signal in said write-in phase of operation, and a balancing transistor coupled between said first and second digit lines of the associated digit line pair for conducting said first digit line with said second digit line in the absence of said column selecting signal in said write-in phase of operation.

* * * * *

UNITED STATES PATENT AND TRADEMARK OFFICE
CERTIFICATE OF CORRECTION

| | | |
|---|---|---|
| PATENT NO. | : | 5,305,264 |
| DATED | : | April 19, 1994 |
| INVENTOR(S) | : | Takahashi |

It is certified that error appears in the above-identified patent and that said Letters Patent is hereby corrected as shown below:

On the title page, item [73]:
    Assignee, delete "Nec", insert --NEC--.

Col. 2, line 59, delete "2nis", insert --2n is--.

Col. 17, line 34, delete "and a write-in phase of operation," and lines 35-68 and;

Col. 18 delete lines 1-4.

Signed and Sealed this

Eighth Day of November, 1994

BRUCE LEHMAN

Attest:

Attesting Officer

Commissioner of Patents and Trademarks